United States Patent [19]

Trofimenkoff et al.

[11] Patent Number: 4,847,620
[45] Date of Patent: Jul. 11, 1989

[54] CLOCK-CONTROLLED VOLTAGE-TO-FREQUENCY CONVERTER

[76] Inventors: Frederick N. Trofimenkoff, #20 Varcourt Place, N.W., Calgary, Alberta, Canada, T3A0G8; Chun O. Li, 64 Edgeburn Crescent, N.W., Calgary, Alberta, Canada, T3A3E6; Daniel J. Paslawski, 2435 Fourth Avenue, Calgary, Alberta, Canada, T2N0P3

[21] Appl. No.: 117,216
[22] Filed: Nov. 4, 1987
[51] Int. Cl.[4] .............................................. H03M 1/52
[52] U.S. Cl. .................................. 341/128; 307/261; 328/151
[58] Field of Search ................ 307/261, 269; 328/127, 328/151; 340/347 AD, 347 NT; 341/128, 167

[56] References Cited

U.S. PATENT DOCUMENTS

| | | | |
|---|---|---|---|
| 3,660,834 | 5/1972 | Picot et al. | 340/347 NT |
| 3,970,943 | 7/1976 | Chapman et al. | 328/151 |
| 4,118,696 | 10/1978 | Warther | 340/347 NT |
| 4,410,812 | 10/1983 | Hönig et al. | 307/350 |
| 4,446,439 | 5/1984 | Mizumoto et al. | |
| 4,558,301 | 12/1985 | Trofimenkoff et al. | |
| 4,584,566 | 4/1986 | Arcara | 340/347 AD |
| 4,623,800 | 11/1986 | Price et al. | |

Primary Examiner—William M. Shoop, Jr.
Assistant Examiner—Marc S. Hoff

[57] ABSTRACT

A clock-controlled voltage-to-frequency converter comprising a reference voltage source, an integrator for receiving the reference voltage and a variable input voltage and producing an output having a triangular waveform, the integrator including a capacitor which is charged at a rate proportional to the input voltage and discharged at a rate proportional to the difference between the reference voltage and the input voltage, the charging and discharging occurring during a time interval $T_o$, a clock pulse source for generating a continuous series of clock pulses, a counter responsive to the clock pulses for terminating the discharging of the capacitor and initiating the charging of the capacitor at a fixed time interval following termination of the charging of the capacitor, a logic circuit responsive to the output of the integrator for terminating the charging of the capacitor and initiating the discharging of the capacitor when the integrator output rises above a preselected threshold level, the time required for the capacitor to charge to the threshold level varying in accordance with the magnitude of the input voltage.

6 Claims, 3 Drawing Sheets 4,847,620

CLOCK-CONTROLLED VOLTAGE-TO-FREQUENCY CONVERTER

FIELD OF THE INVENTION

The present invention relates to clock-controlled voltage-to-frequency converters suitable for use in analog-to-digital converters and, more particularly, to converters of the type which use an integrator to produce a triangular waveform, which in turn is used to produce a series of pulses having periods which are proportional to the magnitude of a variable input voltage.

SUMMARY OF THE INVENTION

It is a primary object of the present invention to provide a clock-controlled voltage-to-frequency converter which is capable of producing high-resolution analog-to-digital conversion within a short conversion time. In this connection, a related object is to provide a high-resolution, direct-counting, analog-to-digital converter which is clock-controlled.

It is another important object of this invention to provide such a clock-controlled voltage-to-frequency converter whose output is, to the first order, substantially independent of circuit component values.

Another object of this invention is to provide such an improved clock-controlled voltage-to-frequency converter which has low power consumption and a low parts count.

It is a further object of this invention to provide such an improved clock-controlled voltage-to-frequency converter which is readily adaptable to either single or dual power-supply operation, voltage gain and linearization, and/or use with resistance-transducers.

Other objects and advantages of the invention will be apparent from the following detailed description and the accompanying drawings.

In accordance with the present invention, the foregoing objectives are realized by providing a clock-controlled voltage-to-frequency converter comprising a reference voltage source; an integrator for receiving the reference voltage and a variable input voltage and producing an output having a triangular waveform, the integrator including a capacitor which is charged at a rate proportional to the input voltage and discharged at a rate proportional to the difference between the reference voltage and the input voltage, the charging and discharging occurring during a time interval $T_o$; a clock pulse source for generating a continuous series of clock pulses; counting means responsive to the clock pulses for terminating the discharging of the capacitor and initiating the charging of the capacitor at a fixed time interval following termination of the charging of the capacitor; and logic means responsive to the output of the integrator for terminating the charging of the capacitor and initiating the discharging of the capacitor when the integrator output rises above a preselected threshold level, the time required for the capacitor to charge to the threshold level varying in accordance with the magnitude of the input voltage.

DESCRIPTION OF THE PREFERRED EMBODIMENT

Figure 1:
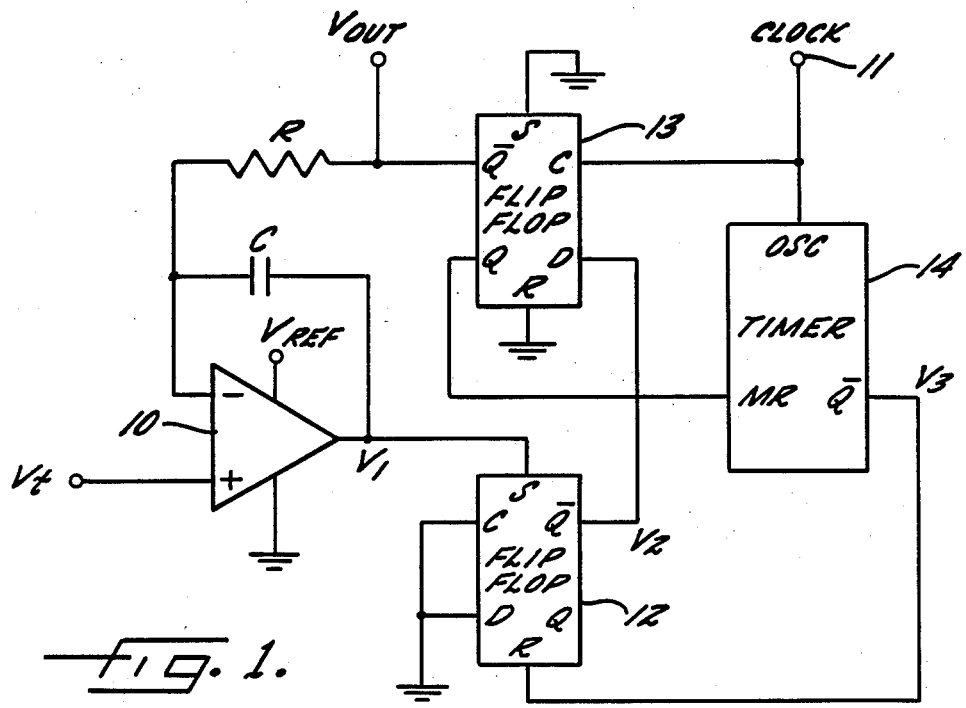
FIG. 1 is a schematic diagram of a clock-controlled voltage-to-frequency converter embodying the present invention.

While the invention is susceptible to various modifications and alternative forms, specific embodiments thereof have been shown by way of example in the drawings and will be described in detail. It should be understood, however, that it is not intended to limit the invention to the particular forms disclosed but, on the contrary, the intention is to cover all modifications, equivalents, and alternatives falling within the scope of the invention as defined by the appended claims.

Turning now to the drawings and referring first to FIG. 1, the illustrative system will be described with reference to the waveforms of FIG. 2 as well as the system diagram of FIG. 1; the location of each of the waveforms of FIG. 2 in the system of FIG. 1 is identified by the addition to FIG. 1 of the same reference characters that appear in the left margin of FIG. 2. All the active components in the system of FIG. 1 are powered from a single supply voltage $V_{ref}$ so that the high level of any binary signal is at $V_{ref}$ volts and the low level is at zero volts.

The input signal for the system of FIG. 1 is a variable analog voltage $V_t$ applied to the non-inverting input of an operational amplifier 10. The amplifier 10 cooperates with a resistor R and a capacitor C to form an integrator. The capacitor C is connected between the inverting input and the output of the operational amplifier 10, while the resistor R is connected between the inverting input of the amplifier 10 and the output of the entire system.

The system of FIG. 1 uses the output of the integrator to produce a binary output signal $V_{out}$ comprising a series of pulses having a period $T_o$ which varies in proportion to the magnitude of the variable input voltage $V_t$. As will be described in detail below, the width $T_p$ of the output pulses is fixed by a clock and counter, and the average ratio of the pulse width $T_p$ to the pulse period $T_o$ over a sufficiently long time is proportional only to the ratio of the input voltage $V_t$ to the fixed reference voltage $V_{ref}$. Because $T_p$ is fixed, the average output frequency $f_{oave}=1/T_{oave}$ is dependent only on the ratio of $V_t$ to $V_{ref}$ and the clock frequency. This ratio is also independent, to first order, of the values of the capacitor C and the resistor R.

The entire system of this invention is synchronized with a continuous series of high-frequency clock pulses. Both edges of the output pulses at $V_{out}$ are controlled by positive edges of the clock pulses. Consequently, the converter is capable of providing high-resolution analog-to-digital conversion.

During the portion of each cycle of operation of the illustrative system when the binary output signal $V_{out}$ is low, the capacitor C charges at a rate proportional to the magnitude of the variable input voltage $V_t$. Thus, the integrator output voltage $V_1$ ramps up during this portion of each cycle (see FIG. 2). The charging of the capacitor C and the resultant ramping up of $V_1$ continues as long as the converter output $V_{out}$ remains low.

The time at which $V_{out}$ goes high is determined by the rate at which the integrator output voltage $V_1$ ramps up due to the charging of the capacitor C. This ramp-up rate determines when $V_1$ reaches a fixed threshold level $V_{th}$, i.e., the switching point, of a set-reset flip flop 12 which receives the voltage $V_1$ at its "set" input. The $\overline{Q}$ output of the flip flop 12 is a binary signal $V_2$ which goes low each time $V_1$ reaches the threshold level $V_{th}$ (see FIG. 2). This signal $V_2$ is applied to the D input of a D-type flip flop 13 whose clock input receives clock pules from the source 11. Thus, whenever $V_2$ goes low, the positive edge of the next clock pulse received by the flip flop 13 causes the $\overline{Q}$ output $V_{out}$ to go high (see FIG. 2). This $\overline{Q}$ output $V_{out}$ is the binary output of the converter, and is also the voltage which is applied to the resistor R.

When the $\overline{Q}$ output $V_{out}$ of the flip flop 13 goes high, the Q output goes low, thereby triggering the master reset of a timer 14 to initiate the counting of a preselected number m of clock pulses. When m clock pulses have been counted, the $\overline{Q}$ output of the timer 14 produces an output pulse $V_3$ which is supplied to the reset input of the flip flop 12. This causes the $\overline{Q}$ output $V_2$ of the flip flop 12 to go high. This signal $V_2$ is the signal supplied to the D input of the flip flop 13, so $V_{out}$ goes low in response to the positive edge of the next clock pulse received by the flip flop 13. This terminates the discharging, and initiates the charging of the capacitor C, thereby completing a single cycle of operation.

It will be recalled that the capacitor C charges whenever $V_{out}$ is low. When $V_{out}$ goes high, the charging of the capacitor C terminates and the capacitor immediately starts to discharge at a rate proportional to the difference between the input voltage $V_t$ and the reference voltage $V_{ref}$ (see FIG. 2). It will be appreciated that the time required for the capacitor C to charge to the fixed threshold level $V_{th}$ (which causes $V_{out}$ to go high) is determined by the rate at which the capacitor was charged, which in turn depends on the magnitude of the variable input voltage $V_t$. The time required to discharge the capacitor C in any given cycle is essentially constant, but the overall period $T_o$ of the charge-discharge cycle in any given cycle is a function of the magnitude of the variable input voltage $V_t$ that determines the rate at which the capacitor is charged.

Figure 2:
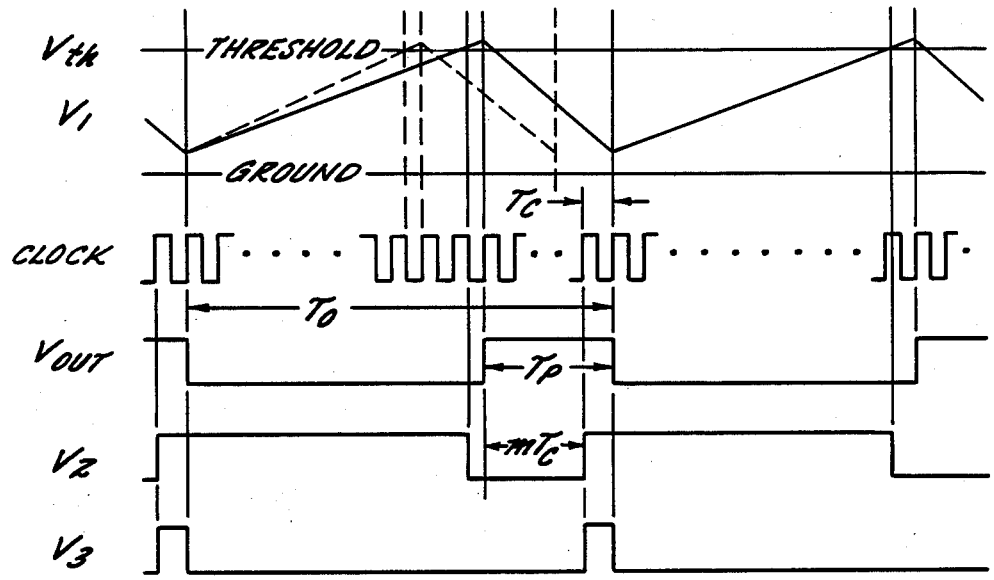
FIG. 2 is a series of waveforms produced at various points in the system of FIG. 1.

The effect of the magnitude of $V_t$ on the pulse width $T_p$ can be illustrated by a second example represented by the broken-line waveform for $V_1$ in FIG. 2. This broken-line waveform is the result of an input voltage $V_t$ having a magnitude greater than that which produces the solid-line waveform for $V_1$. Because of the increase in $V_t$, the capacitor C charges at a faster rate and thus reaches the threshold level $V_{th}$ in a shorter time period $(T_o - T_p)$. The capacitor discharges at a slower rate, but the discharge time $T_p$ remains constant because it is fixed by the timer 14. The end result is a shorter period $T_o$, as illustrated in FIG. 2.

For single-ended power supply operation, the charge balance for the capacitor C for a time $NT_c$ corresponding to n periods is:

$$-\frac{V_t NT_c}{R} + \frac{nT_p V_{ref}}{R} = 0$$

where $T_p$ is the capacitor discharge time, $T_c$ is the clock period, and N is the number of clock periods in the n periods (maximum error will be $T_c V_t/R$). It then follows that the average output frequency $f_{oave}$ is dependent only on the ratio of $V_t$ to $V_{ref}$ and the clock frequency:

$$f_{oave} = \frac{n}{NT_c} = \frac{V_t}{V_{ref}T_p}$$

To produce a digital output representing $V_t/V_{ref}$, an inverse counting A/D conversion scheme may be utilized. In this inverse counting scheme, $$\frac{V_t}{V_{ref}} = \frac{n(m+1)T_c}{NT_c} = \frac{n(m+1)}{N}$$

The maximum error in N will be $\pm 1$ count, and as a result $V_t/V_{ref}$ can be resolved to within $\pm 1$ count in N. For a fixed conversion time and a large n, the resolution is governed by the length of $T_{convert}$ described below. As an alternative, the conversion can be carried out by fixing the number of periods n, in which case only one counter is required. In this case $V_t/V_{ref}$ is still given by $$\frac{V_t}{V_{ref}} = \frac{n(m+1)}{N}$$

The resolution of $V_t/V_{ref}$ will still be $\pm 1$ part in N, and the minimum value of N will be $n(m+1)$ at full scale. The conversion time will be directly dependent on $T_{oave}$ and can be as large as $(n+1)T_{oave}$.

Figure 3:
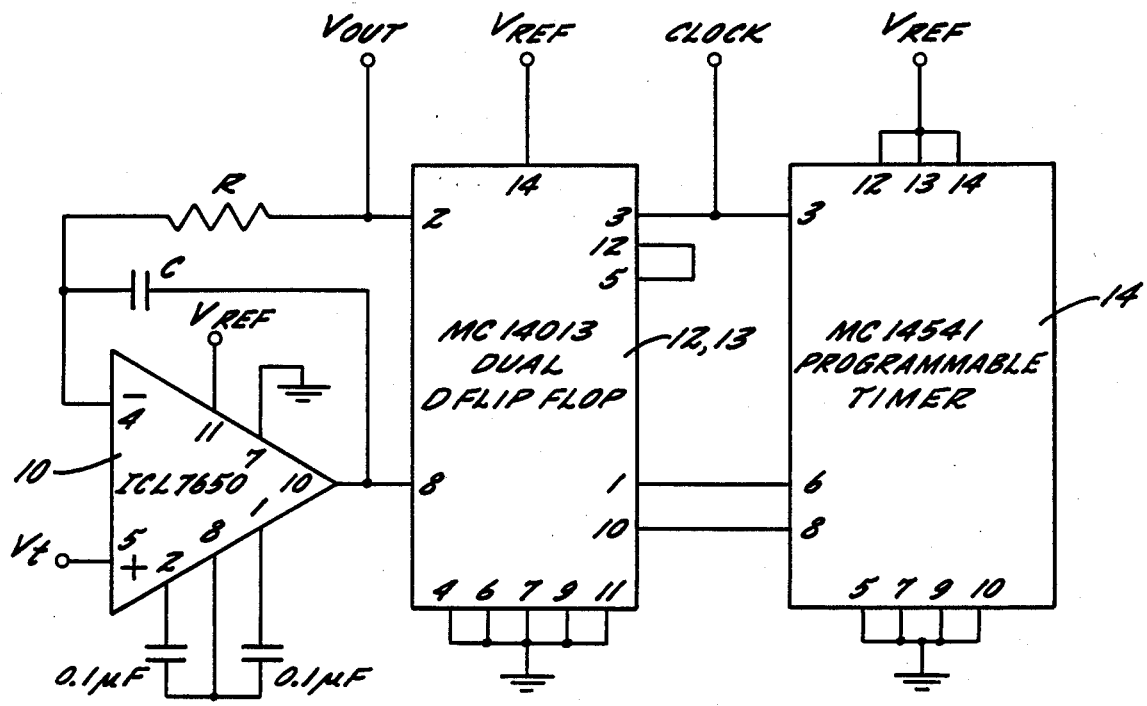
FIG. 3 is a diagram of the system of FIG. 1 as implemented with commercially available components.

A practical implementation of the system of FIG. 1 is shown in FIG. 3, using commercially available chips. The operational amplifier 10 is an ICL7650, the D flip flops 12 and 13 are an MC14013, and the timer 14 is an MC14541 programmable timer. Because this converter is clock-controlled, it has a high degree of precision and resolution. As can be appreciated from FIGS. 1 and 3, the converter also has a low parts count, can be operated from a single-ended power supply, and requires only a small amount of power. Furthermore, the accuracy of the system is, to first order, dependent only on the reference voltage and not on the values of the other components in the system.

Figure 4:
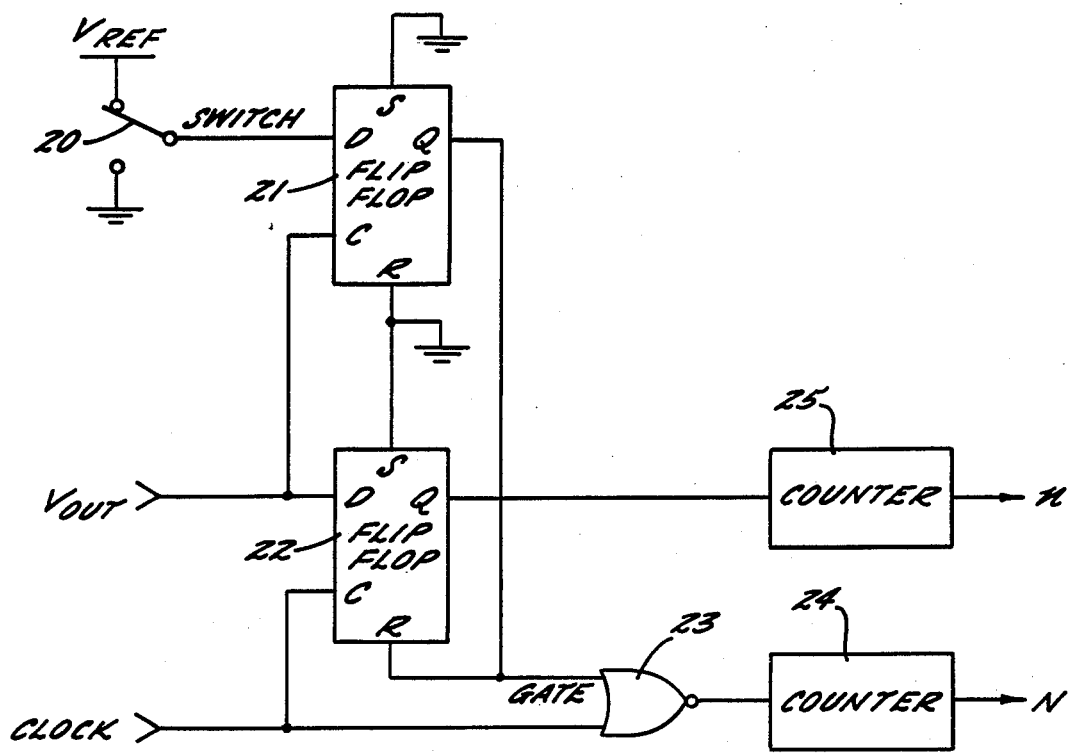
FIG. 4 is a schematic diagram of an inverse counting analog-to-digital converter utilizing the voltage-to-frequency converter of FIG. 1.
Figure 5:
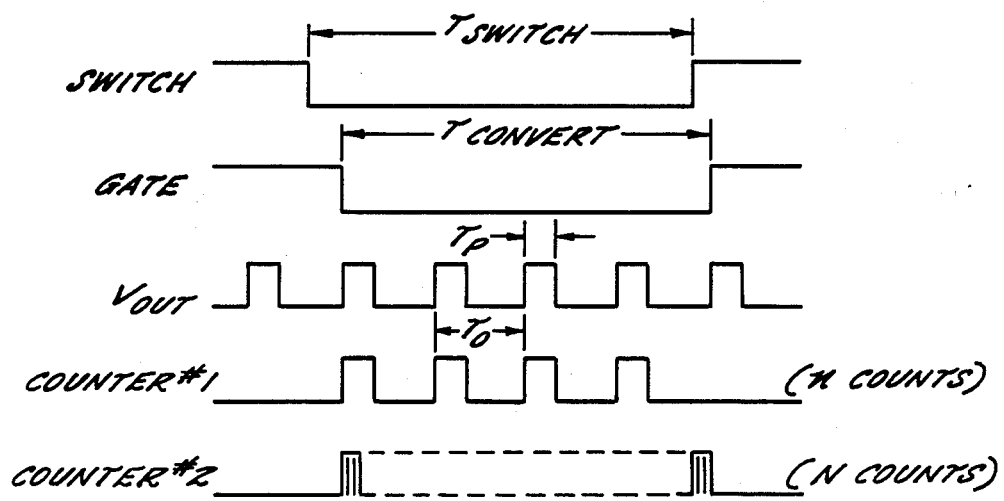
FIG. 5 is a series of waveforms produced at various points in the converter of FIG. 4.

To implement the inverse counting scheme described above, the A/D conversion system of FIGS. 4 and 5 may be utilized. In this system, a switch 20 applies the reference voltage $V_{ref}$ to the D input of a flip flop 21 for a time $T_{switch}$. When $V_{ref}$ is not connected to the D input, the switch 20 connects that input to ground. The output signal $C_{out}$ is supplied to clock input of the flip flop 21 and the D input of a second flip flop 22. Clock pulses from the source 11 are supplied to the clock input of the flip flop 22 and to a NOR gate 23 whose other input is the Q output of the flip flop 21.

The Q output of the flip flop 21 goes low in response to the first pulse in $V_{out}$ after the switch 21 has been moved to its low (ground) position, and the Q output remains low until the first pulse in $V_{out}$ after the switch has restored a high D input to the flip flop 21. As a result, the gate 23 passes clock pulses to a counter 24 for n cycles, thereby accumulating N counts in the counter 24. These n cycles occur within a time period $T_{convert}$ which is up to one period longer than the interval $T_{switch}$ and is synchronized with the positive edges of the pulses in $V_{out}$. The Q output of the counter 22 produces the same number of output pulses appearing in $V_{out}$ during the time interval $T_{convert}$ when the gate 23 is open, thereby accumulating n pulses in a counter 25 connected to the Q output of the flip flop 22. The ratio of n/N of the counts accumulated in the two counters 25, 24 corresponds to the ratio $V_t/V_{ref}$.

Gain can be provided in the illustrative system by simply connecting a resistor between ground and the inverting input of the operational amplifier 10, although this makes the output dependent on the ratio of the two resistors. Linearization can also be added to the illustrative system by connecting a further resistor between ground and the inverting input of the operational amplifier only when $V_{out}$ is low or only when $V_{out}$ is high. The illustrative system is also particularly well suited for use with resistance bridge transducers, e.g., by connecting such a transducer across the inputs of the operational amplifier 10.

We claim:

1. A clock-controlled voltage-to-frequency converter comprising
   a reference voltage source,
   an integrator for receiving said reference voltage and a variable input voltage and producing an output having a triangular waveform, said integrator including a capacitor which is charged at a rate proportional to the magnitude of the input voltage and discharged at a rate proportional to the difference between said reference voltage and said input voltage, said charging and discharging occurring during a time interval $T_o$, said discharging occurring during a time interval $T_p$,
   a clock pulse source for generating a continuous series of clock pulses,
   counting means responsive to said clock pulses for terminating the discharging of said capacitor and initiating the charging of said capacitor at a fixed time interval following termination of the charging of said capacitor, whereby said discharging interval $T_p$ is maintained at a constant level while said charging and discharging interval $T_o$ is varied in accordance with the magnitude of said input voltage,
   logic means responsive to the output of said integrator for terminating the charging of said capacitor and initiating the discharging of said capacitor when said integrator output rises above a preselected threshold level, the time required for said capacitor to charge to said threshold level varying in accordance with the magnitude of said input voltage, and
   means for generating an output signal comprising a series of pulses having a pulse width corresponding to said constant discharging interval $T_p$ and a frequency which is a linear function of said input voltage.

2. A clock-controlled voltage-to-frequency converter as set forth in claim 1 wherein said logic means includes a set-reset flip flop which receives the output of said integrator and is set when the integrator output voltage increases to a predetermined threshold level.

3. A clock-controlled voltage-to-frequency converter as set forth in claim 2 wherein said logic means also includes a D flip flop clocked by said clock pulses and receiving at its D input the output of said set-reset flip flop, whereby the output of said D flip flop changes state in response to the first clock pulse following the setting of said set-reset flip flop.

4. A clock-controlled voltage-to-frequency converter as set forth in claim 3 wherein said counting means comprises a timer receiving said clock pulses and the output of said D flip flop so that the timer starts counting clock pulses when the output of said D flip flop changes state in response to the first clock pulse following the setting of said set-reset flip flop, and then counts a predetermined number of clock pulses, said timer producing a binary output which changes state upon completion of the counting of said predetermined number of clock pulses; and said set-reset flip flop receives said binary output of said timer and is reset when said binary output changes state upon completion of said counting, whereby the output of said D flip flop changes state in response to the first clock pulse following the resetting of said set-reset flip flop.

5. A clock-controlled voltage-to-frequency converter comprising
   a reference voltage source,
   an integrator for receiving said reference voltage and a variable input voltage and producing an output having a triangular waveform, said integrator including a capacitor which is charged at a rate proportional to the magnitude of the input voltage and discharged at a rate proportional to the difference between said reference voltage and said input voltage, said charging and discharging occurring during a time interval $T_o$, said discharging occurring during a time interval $T_p$,
   a clock pulse source for generating a continuous series of clock pulses,
   means for terminating the charging of said capacitor and initiating the discharging of said capacitor in response to the first clock pulse following the charging of said capacitor to a preselected threshold level,
   counting means receiving said clock pulses and producing a binary control signal which changes state in response to the counting of a preselected number of clock pulses following termination of the charging of said capacitor,
   means for terminating the discharging of said capacitor and initiating the charging of said capacitor in response to the first clock pulse following the first change in the state of said control signal after termination of the charging of said capacitor, whereby said discharging interval $T_p$ is maintained at a constant level while said charging and discharging interval $T_o$ is varied in accordance with the magnitude of said input voltage, and
   means responsive to said binary control signal for generating an output signal comprising a series of pulses having a pulse width corresponding to said constant discharging interval $T_p$ and a frequency which is a linear function of said input voltage.

6. A clock-controlled, voltage-to-frequency converter as set forth in claim 5 wherein said preselected threshold level is the switching point of a set-reset flip flop.

* * * * *